United States Patent [19]
Dhong et al.

[11] Patent Number: 5,144,165
[45] Date of Patent: Sep. 1, 1992

[54] CMOS OFF-CHIP DRIVER CIRCUITS

[75] Inventors: Sang H. Dhong, Mahopac; Wei Hwang, Armonk; Hyun J. Shin, Mahopac, all of N.Y.

[73] Assignee: International Business Machines Corporation, Armonk, N.Y.

[21] Appl. No.: 628,255

[22] Filed: Dec. 14, 1990

[51] Int. Cl.[5] .................. H03K 19/20; H03K 3/01
[52] U.S. Cl. .................. 307/451; 307/296.2; 307/482; 307/475
[58] Field of Search .............. 307/451, 475, 270, 273, 307/482, 362–363, 296.2, 296.8, 279, 473; 365/189.11, 226–228

[56] References Cited

U.S. PATENT DOCUMENTS

| | | | |
|---|---|---|---|
| 4,217,502 | 8/1980 | Suzuki et al. | 307/475 |
| 4,769,784 | 9/1988 | Doluca et al. | 365/226 |
| 4,782,250 | 10/1988 | Adams et al. | 307/473 |
| 4,963,766 | 10/1990 | Lundberg | 307/473 |

Primary Examiner—David Hudspeth
Assistant Examiner—Andrew Sanders
Attorney, Agent, or Firm—Whitham & Marhoefer

[57] ABSTRACT

Output driver circuits which do not require two stacked PMOS pull-up transistors in order to interface a lower on-chip supply voltage with a higher voltage off-chip bus provide a significant savings in chip area for DRAMs. According to a first embodiment, an on-chip pump circuit generates the necessary voltage to interface to the external bus. A second embodiment detects and compares the external bus voltage to the on-chip $V_{DD}$ during tri-state. The higher voltage between the bus and $V_{DD}$ is used to control the PMOS pull-up device properly. A third embodiment is a hybrid of the first and second embodiments. The external bus is compared to $V_{DD}$ as in the second embodiment, but a higher-than-$V_{DD}$ voltage is generated on-chip as in the first embodiment. This on-chip generated voltage is used to control the PMOS pull-up device instead of the bus voltage when the bus voltage is higher than $V_{DD}$.

16 Claims, 4 Drawing Sheets

CMOS OFF-CHIP DRIVER CIRCUITS

BACKGROUND OF THE INVENTION

1. Field of the Invention

The present invention generally relates to off-chip driver circuits having particular application to CMOS integrated circuits (ICs) and, more particularly, to output driver circuits that provide off-chip interfacing to an external bus which has a voltage that is higher than on-chip $V_{DD}$ without stacking PMOS pull-up transistors, resulting in significant area saving.

2. Definition of Terms

The following terms or abbreviations are used in the following disclosure:

CMOS - Complementary Metal Oxide Semiconductor, specifically as applied to field effect transistors (FETs) combining the electrical properties of n-type and p-type semiconductors.

DRAM - Dynamic Random Access Memory, specifically as applied to an array of memory cells much simpler than the cells of a static RAM but requiring periodic refresh and/or refresh after a read operation.

NMOS - N-type channel Metal Oxide Semiconductor, specifically as applied to field-effect transistors that utilize the properties of n-type semiconductor material that, when energized, produces a flow of negative charge carriers (electrons).

PMOS - P-type channel Metal Oxide Semiconductor, specifically as applied to field-effect transistors that utilize the properties of p-type semiconductor material that, when energized, produces a flow of positive charge carriers (holes).

3. Description of the Prior Art

In current and future CMOS DRAMs (4 Mb and beyond), the on-chip supply voltage, $V_{DD}$, is often lower than the voltage of the external bus to which the output drivers have to interface because of restrictions characteristic of sub-micron CMOS devices. For example, typical 4 and 16 Mb DRAMs operate at a supply voltage, $V_{DD}$, of 3V internally but more often than not have to interface with a bus at a supply voltage of 5V. The trend is expected to continue for 64 Mb DRAMs and beyond because 0.35 μm or shorter devices needed for these DRAMs may have an optimum performance at a lower $V_{DD}$ voltage than the 3V internal bus currently used.

A simplified schematic diagram of a conventional output buffer which interfaces on-chip $V_{DD}$ to a higher voltage external bus is shown in FIG. 1. This circuit is described by T. Williams et al., in "An Experimental 1-Mbit CMOS SRAM with Configurable Organization and Operation", *IEEE Journal of Solid-State Circuits*, October 1988, pp. 1090 et seq. During tri-state, the external bus voltage turns off transistor $T_2$ which floats the n-well potential of PMOS transistors $T_2$, $T_3$ and $T_4$, thus preventing forward injection of PN diodes and latch-up However, the two PMOS transistors $T_4$ and $T_5$ are stacked in series and require an area four times larger than using a single PMOS transistor. As an example, two stacked devices, each having a channel width-to-length ratio of 1600/1 (total area equivalent to a channel width-to-length ratio of 3200/1), are needed to achieve the same pull-up slew rate as a single device with a channel width-to-length ratio of 800/1. For a ×8 or ×16 data-out chip organization, the number of extra transistors is 16 and 32, respectively. The large chip area required by these transistors is a serious drawback for CMOS DRAMs, which are cost-performance sensitive.

Further examples of the prior art are to be found in U.S. Pat. No. 4,782,250 to Adams et al. and U.S. Pat. No. 4,709,162 to Braceras et al. These patents disclose off-chip driver circuits which interface a lower on-chip supply voltage to a higher voltage bus, but they too require stacking of two output devices.

SUMMARY OF THE INVENTION

It is therefore an object of the present invention to provide output driver circuits which do not require two stacked PMOS pull-up transistors in order to interface a lower on-chip supply voltage with a higher voltage off-chip bus.

According to a first embodiment of the invention, an on-chip pump circuit generates the necessary voltage to interface to the external bus. A second embodiment detects and compares the external bus voltage to the on-chip $V_{DD}$ during tri-state. The higher voltage between the bus and $V_{DD}$ is used to control the PMOS pull-up device properly. A third embodiment is a hybrid of the first and second embodiments. The external bus is compared to $V_{DD}$ as in the second embodiment, but a higher-than-$V_{DD}$ voltage is generated on-chip as in the first embodiment. This on-chip generated voltage is used to control the PMOS pull-up device instead of the bus voltage when the bus voltage is higher than $V_{DD}$.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
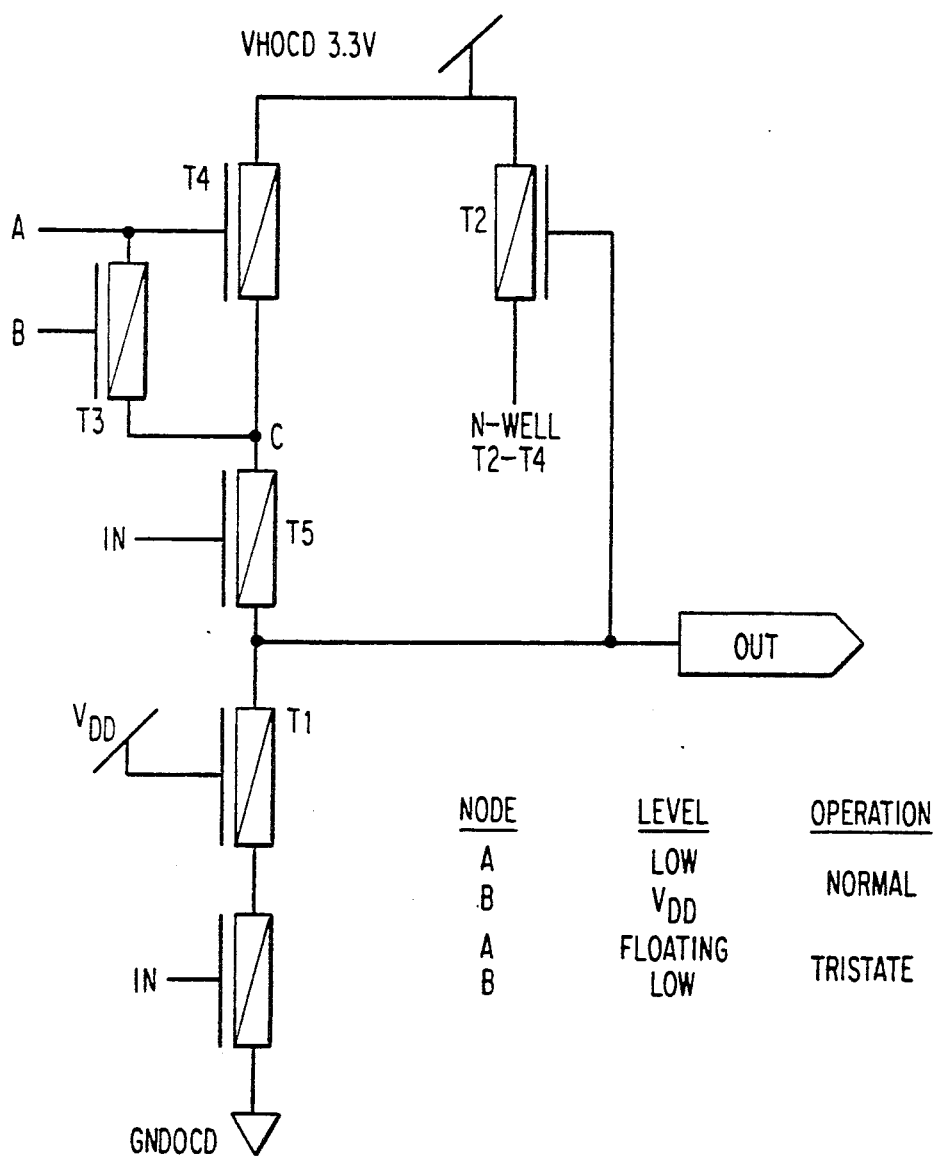
FIG. 1 is a schematic diagram of a prior art off-chip interfacing circuit.
Figure 2:
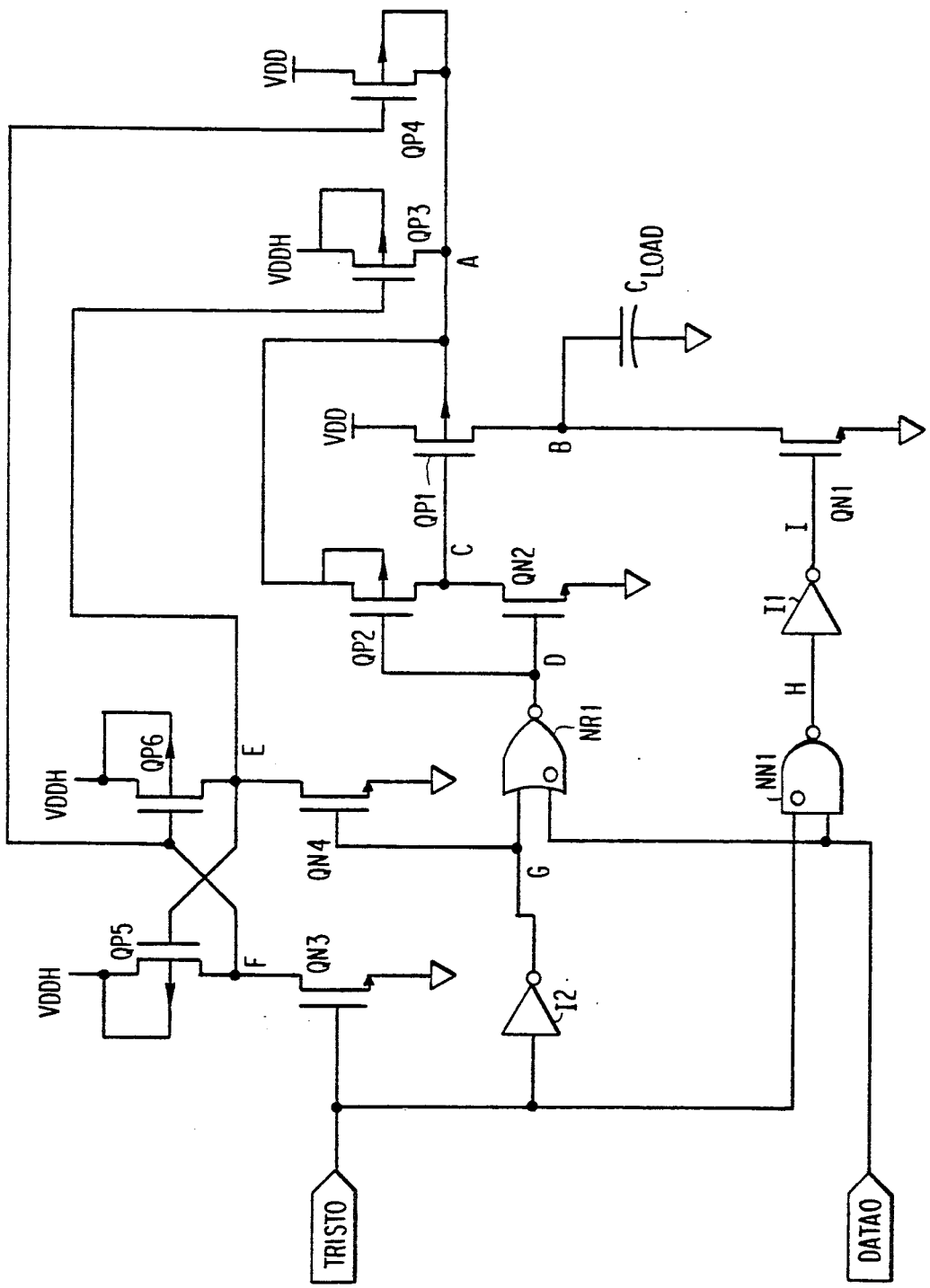
FIG. 2 is a schematic diagram of an off-chip driver circuit according to a first embodiment of the invention.

Referring now to the drawings, and more particularly to FIG. 2, there is shown the output driver circuit according to the first embodiment of the invention. This circuit comprises a single PMOS pull-up transistor $QP_1$ having its source electrode connected to a voltage source $V_{DD}$, its n-well to node A, its drain electrode to node B, and its gate electrode to a common node C with the drain electrodes of the complementary pair PMOS transistor $QP_2$ and NMOS transistor $QN_2$ Node A is also connected to the source and n-well of transistor $QP_2$, while the source of transistor $QN_2$ is connected to electrical circuit ground or GND. Node B is also connected to the drain electrode of NMOS transistor $QN_1$ which has its source electrode connected to GND. A capacitive load $C_{LOAD}$ is connected to node B to simulate a typical external bus.

A level-shifting circuit comprises a pair of cross-coupled PMOS transistors $QP_5$ and $QP_6$ having their respective gate electrodes and drain electrodes interconnected and their source electrodes and n-wells connected to a voltage source, $V_{DD}H$. $V_{DD}H$ is a voltage source which is the same as or larger than the external bus voltage. The common connection of the gate electrode of transistor $QP_5$ and the drain electrode of transistor $QP_6$ is designated as node E, while the common connection of the gate electrode of transistor $QP_6$ with the drain electrode of transistor $QP_5$ is designated as node F. The drain electrodes of PMOS transistors $QP_5$ and $QP_6$ are connected via respective NMOS transistors $QN_3$ and $QN_4$ to GND.

The gate of transistor $QN_3$ is connected to tri-state control terminal $TRIST_0$. The voltage level at terminal $TRIST_0$ is high during off-chip driving and low or GND during the tri-state condition. The same terminal $TRIST_0$ is connected via invertor $I_2$ to node G, the gate of transistor $QN_4$ and one input of NOR gate $NR_1$. The output of NOR gate $NR_1$ is connected in common to node D and the gates of complementary pair transistors $QP_2$ and $QN_2$.

Nodes E and F from the cross-coupled transistors $QP_5$ and $QP_6$ are respectively connected to the gates of PMOS transistors $QP_3$ and $QP_4$. The source electrode and n-well of transistor $QP_3$ are connected to the voltage source $V_{DDH}$, while the source electrode of transistor $QP_4$ is connected to the voltage source $V_{DD}$. The drain electrode of transistor $QP_3$ is connected to node A, as are the drain electrode and n-well of transistor $QP_4$.

Tri-state terminal $TRIST_0$ is also connected to an inverting input of NAND gate $NN_1$. The other, non-inverting input of NAND gate is connected to data terminal $DATA_0$. The data terminal $DATA_0$ is also connected to an inverting input of NOR gate $NR_1$. The output of NAND gate $NN_1$ is connected to node H and invertor $I_1$. The output of invertor $I_1$ is connected to node I and the gate of NMOS transistor $QN_1$. The invertors $I_1$ and $I_2$ are each composed of two transistors, one PMOS and one NMOS, while the NOR gate $NR_1$ and the NAND gate $NN_1$ are each composed of four transistors, two PMOS and two NMOS.

The circuit operates as follows. During off-chip driving, the signal $TRIST_0$ is high and the node G is low, which forces the nodes E and F to be high ($V_{DDH}$) and low (GND), respectively. The cross-coupling of transistors $QP_5$ and $QP_6$ provides the necessary voltage shifting from $V_{DD}$, the high level of tri-state terminal $TRIST_0$, to $V_{DDH}$. Consequently, PMOS transistor $QP_3$ is fully off and $QP_4$ is on. The node A and the n-well of $QP_1$ are at $V_{DD}$. With these conditions, NOR gate $NR_1$ and transistors $QP_2$ and $QN_2$ perform the necessary logic for $QP_1$ with $DATA_0$ as one of the inputs. The logic for $QN_1$ is provided by the NAND gate $NN_1$ and invertor $I_1$.

During tri-state, with terminal $TRIST_0$ at ground, the nodes E and F are low and high, respectively. Transistor $QP_3$ is on and transistor $QP_4$ is off, which keeps the node A at $V_{DDH}$. The node G is high and the output of the NOR gate $NR_1$ is low. Transistor $QP_2$ is on and transistor $QN_2$ is off. The node C is at $V_{DDH}$. As a result, the output pull-up PMOS transistor $QP_1$ has its gate and n-well at $V_{DDH}$ and is completely off as long as the external bus is not higher than $V_{DDH}$. The output node H of the NAND gate $NN_1$ is high and transistor $QN_1$ is off.

The circuit requires on-chip generation of the voltage $V_{DDH}$, which can be easily achieved by a charge-pumping circuit. The charge-pumping circuit only has to provide the switching current for the level-shifting circuit composed of transistors $QN_3$, $QN_4$, $QP_5$, and $QP_6$ and for the gate (node C) and the n-well of transistor $QP_1$ when the output buffer is n-well tri-stated. The pump circuit is shared among the output buffers and its impact on the chip area is small. If the chip has an on-chip $V_{DD}$ step-down regulator, the external power supply can be used as $V_{DDH}$, eliminating the need for the pump circuit. This is particularly useful where the external $V_{DD}$ and bus are 5V and the on-chip $V_{DD}$ is 3.3 V.

The worst case electric field for pull-up transistor $QP_1$ is when the node C is at $V_{DDH}$ with the external bus at ground in the tri-stated condition. This could be a concern, depending on the technology implementation. Drain engineering, longer channel length, thicker oxide, reduced life-expectancy (40,000 from 100,000 hours), and tighter external $V_{DD}$ range ($\pm 5\%$ from $\pm 10\%$) could help the situation. For example, for a cost-performance 4 Mb DRAM chip, the worst-case electric field for pull-up transistor $QP_1$ is acceptable for 40,000 hour parts operating at 5V $\pm 0.3$ V.

Figure 3:
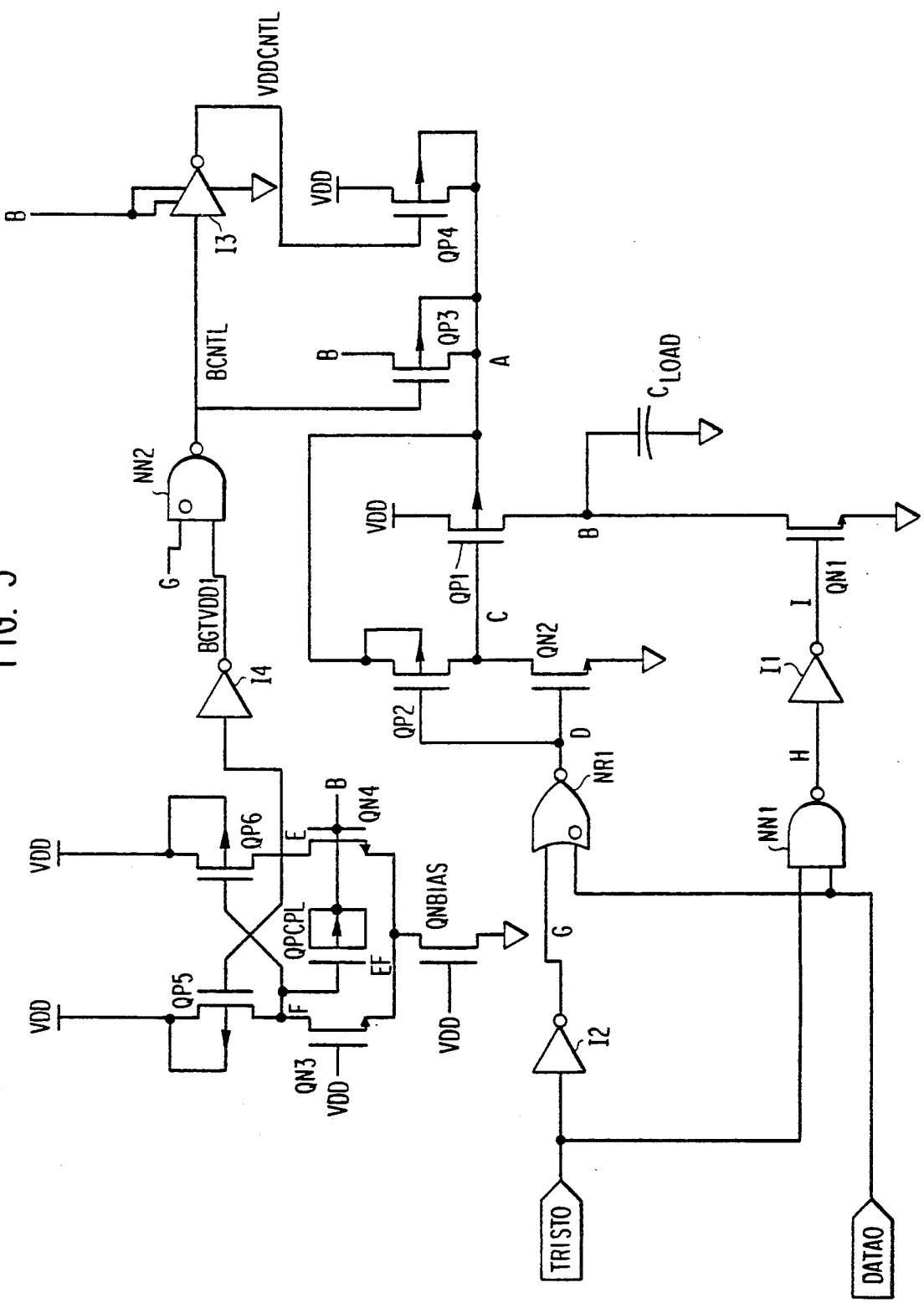
FIG. 3 is a schematic diagram of an off-chip driver circuit according to a second embodiment of the invention.

FIG. 3 shows a second embodiment of the off-chip driving circuit of the invention. This circuit is similar to that of the circuit show in FIG. 2, and where the same circuit elements are employed, this is indicated by the use of the same reference characters.

In FIG. 3, the level detecting circuit comprising transistors $QN_3$, $QN_4$, $QP_5$, and $QP_6$ is not directly connected to transistors $QP_3$ and $QP_4$ as in the circuit of FIG. 2. Rather, node E is connected to an invertor $I_4$, the output of which is connected to one input of NAND gate $NN_2$. Node G, the output of invertor $I_2$, is connected to an inverting input of NAND gate $NN_2$. The output of NAND gate $NN_2$, denoted node $B_{CNTL}$, is connected to the gate electrode of transistor $QP_3$ and, via invertor $I_3$, to the gate electrode of transistor $QP_4$. The invertor $I_3$ is composed of two transistors, one PMOS and one NMOS. The n-well and the source of the PMOS transistor are connected to the node B. Note that the source electrode of transistor $QP_3$ is connected to node B, the output node, while its n-well is connected to node A.

The level detecting circuit is also slightly modified. First of all, the source electrodes for transistors $QP_5$ and $QP_6$ are connected to voltage source $V_{DD}$, rather than a voltage source $V_{DDH}$. The NMOS transistors $QN_3$ and $QN_4$ are connected as a differential pair with their source electrodes being connected in common with the drain electrode of an NMOS transistor $QN_{BIAS}$ having its source electrode connected to GND. The gate electrodes of NMOS transistors $QN_3$ and $QN_{BIAS}$ are both connected to the voltage source $V_{DD}$, while the gate electrode of NMOS transistor $QN_4$ is connected to node B, the output node. A capacitor-connected PMOS transistor $QP_{CPL}$ is connected between node F and the gate of transistor $QN_4$ as a coupling capacitor.

The circuit of FIG. 3 operates as follows. During off-chip driving, the signal at tri-state terminal $TRIST_0$ is high and the node G is low. The output $B_{CNTL}$ of NAND gate $NN_2$ is high and the node $V_{DDCNTL}$ is low. Transistor $QP_4$ is on, and the node A is at $V_{DD}$. The necessary logic functions for pull-up transistor $QP_1$ and transistor $QN_1$ are provided by the NOR gate $NR_1$ and NAND gate $NN_1$, in the same manner as the circuit shown in FIG. 2 with the signal at terminal $DATA_0$ as input. During off-chip driving, the voltage swing of the node B (the output node) is from ground to $V_{DD}$, and transistor $QP_3$ stays off.

During tri-state operation, with terminal $TRIST_0$ low, the nodes H and I are high and low, respectively. The NMOS transistor $QN_1$ is off. The nodes G and D are also high and low, respectively. With transistors $QP_2$ and $QN_2$ on and off, the gate and n-well of transistor $QP_1$ are at the same potential; i.e., nodes A and C are at the same voltage. The PMOS pull-up transistor $QP_1$ will stay off as long as the node A voltage is no less than $V_{DD}$. The control of the node A voltage is provided by the differential pair composed of transistors $QP_5$, $QP_6$, $QN_3$, $QN_4$, and $QN_{BIAS}$, and the logic of invertors $I_3$ and $I_4$ and NAND gate $NN_2$. The PMOS transistor $QP_{CPL}$, serving as a coupling capacitor, improves the transient characteristic of the differential pair without any effect on DC characteristics.

When the output node B is higher than $V_{DD}$, the node E is low and the node $B_{GTVDD1}$ at the output of invertor $I_4$ is high, which forces the nodes $B_{CNTL}$ and $V_{DDCNTL}$ to low and high, respectively. Transistor $QP_3$ is on and transistor $QP_4$ is off, and the node A is at the same voltage as the output node B, which is greater than $V_{DD}$. If the node B is lower than $V_{DD}$, the node E is high and the node $B_{CNTL}$ is at $V_{DD}$ and transistor $QP_3$ is off. Also, transistor $QP_4$ is on with the node $V_{DD}CNTL$ low. The node A is at $V_{DD}$, which biases the gate and n-well of the PMOS output transistor $QP_1$ at $V_{DD}$. Note that the source and n-well of the PMOS transistor of the invertor $I_3$ are connected to the output node B unlike the other invertors which are connected to the voltage source $V_{DD}$. The high level of the node $V_{DDCNTL}$ is the same as the node B, and transistor $QP_4$ turns off completely when the node B is higher than $V_{DD}$. There is no need to have a positive level-shifting circuit between the nodes $B_{CNTL}$ and $V_{DDCNTL}$ because the node $B_{CNTL}$ is always low if the node B is higher than $V_{DD}$, or vice versa.

The electric field concern for the PMOS pull-up transistor $QP_1$ is alleviated because the node C is switched from $V_{DD}$ to the bus-high voltage only when the bus-high voltage is greater than $V_{DD}$. The PMOS transistor in the invertor $I_3$ is on with the node $B_{CNTL}$ low; i.e., when the bus-high voltage at node B exceeds $V_{DD}$. When it is off, the node B is lower than $V_{DD}$.

Figure 4:
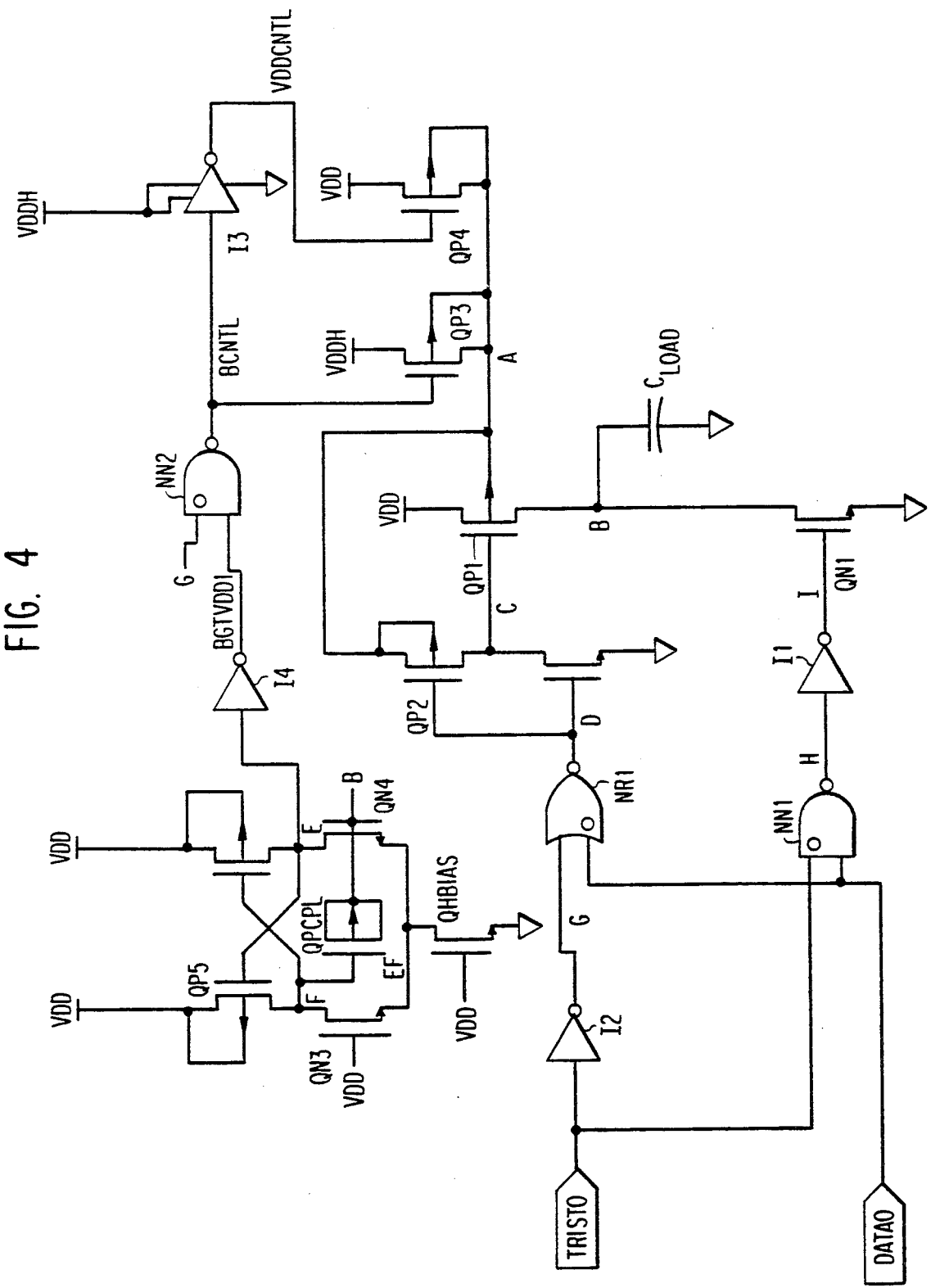
FIG. 4 is a schematic diagram of an off-chip driver circuit according to a third embodiment of the invention.

FIG. 4 shows the circuit of the third embodiment of the invention. This circuit is essentially the same as that of the circuit shown in FIG. 3 except that the inverter $I_3$ and PMOS transistor $QP_3$ are connected to the on-chip high-voltage generator used in the output driver circuit shown in FIG. 2. In this case, the charging and discharging of the gate and n-well of the PMOS pull-up transistor $QP_1$ are done by the on-chip high-voltage generator, $V_{DDH}$. This makes the output driver circuit in FIG. 4 have a smaller output capacitance when it is tri-stated than the output driver circuit shown in FIG. 3.

While the invention has been described in terms of three preferred embodiments, those skilled in the art will recognize that the invention can be practiced with modification within the spirit and scope of the appended claims.

Having thus described our invention, what we claim as new and desire to secure by Letters Patent is as follows:

1. A CMOS output driver circuit for providing off-chip interfacing to an external bus having a higher voltage than an on-chop supply voltage comprising:
 a data terminal connected to receive data to be transmitted off-chip;
 a single PMOS pull-up transistor having gate, source, drain and n-well electrodes, said drain electrode being connected to an output node connected to said external bus, said gate terminal normally being connected to receive said data to be transmitted off-chip via said output node, and said source electrode being connected to said on-chip supply voltage;
 a tri-state control terminal connected to receive a tri-state control signal;
 tri-state means connected to said tri-state control terminal for biasing the n-well of said PMOS pull-up transistor to a higher one of said on-chip supply voltage or a voltage approximately that of said external bus voltage when said output driver circuit is tri-stated;
 an on-chip pump circuit generating said voltage approximating that of said external bus when the output of said driver circuit is tri-stated;
 level shifting circuit means responsive to said tri-state control signal for generating first and second tri-state control signals;
 first gate means responsive to said first tri-state control signal when said driver circuit is tri-stated, said first gate means biasing the n-well of said PMOS pull-up transistor to said voltage of approximating that of said external bus voltage; and
 second gate means responsive to said second tri-state control signal when said driver circuit is not tri-stated, said second gate means biasing the n-well of said PMOS pull-up transistor to said on-chip supply voltage.

2. The output driver circuit recited in claim 1 wherein said level shifting circuit means comprises:
 first and second cross-coupled PMOS transistors each having gate, source, drain and n-well electrodes, said source and n-well electrodes being connected to said voltage approximating that of said external bus voltage, said drain and gate electrodes of said first and second cross-coupled PMOS transistors being connected to one another, respectively, the junction of the drain electrode of said first PMOS transistor and the gate electrode of said second PMOS transistor being connected to said first gate means, and the junction of the drain electrode of said second PMOS transistor and the gate electrode of said first PMOS transistor being connected to said second gate means; and
 first and second NMOS transistors respectively connected in series with said first and second PMOS cross-coupled transistors, said first and second NMOS transistors having gate, source and drain electrodes, said gate electrodes being responsive to said tri-state control signal.

3. The off-chip driver circuit recited in claim 2 further comprising:
 a third NMOS transistor connected in series with said single PMOS pull-up transistor, said third NMOS transistor having gate, source and drain electrodes; and
 logic means connected to said data terminal and said tri-state control terminal, said logic means generating output signals which are applied to the gate electrodes of said third NMOS transistor and said single PMOS pull-up transistor.

4. The output driver circuit recited in claim 3 further comprising a complementary driver circuit between said logic means and the gate of said single PMOS pull-up transistor and wherein said logic means comprises:
- a first invertor having an input connected to said tri-state control terminal and an output providing an inverted tri-state control signal;
- a NOR gate having a first input connected to the output of said invertor, a second inverting input connected to said data terminal, and an output connected to said complementary driver circuit;
- a NAND gate having a first input connected to said data terminal, a second inverting input connected to said tri-state control terminal, and an output; and
- a second invertor having an input connected to the output of said NAND gate and an output connected to the gate of said third NMOS transistor.

5. A CMOS output driver circuit for providing off-chip interfacing to an external bus having a higher voltage than an on-chip supply voltage comprising:
- a data terminal connected to receive data to be transmitted off-chip;
- a single PMOS pull-up transistor having gate, source, drain and n-well electrodes, said drain electrode being connected to an output node connected to said external bus, said gate terminal normally being connected to receive said data to be transmitted off-chip via said output node, and said source electrode being connected to said on-chip supply voltage;
- a tri-sate control terminal connected to receive a tri-state control signal;
- tri-state means connected to said tri-state control terminal for biasing the n-well of said PMOS pull-up transistor to a higher one of said on-chip supply voltage or a voltage approximating that of said external bus voltage when said output driver circuit is tri-stated;
- an on-chip comparator for comparing said bus voltage at the output node to said on-chip supply voltage; and
- gating means for connecting the gate and n-well of said PMOS pull-up transistor to the higher of said on-chip supply voltage and said bus voltage when said driver circuit is tri-stated.

6. A CMOS output driver circuit for providing off-chip interfacing to an external bus having a higher voltage than an on-chip supply voltage comprising:
- a data terminal connected to receive data to be transmitted off-chip;
- a single PMOS pull-up transistor having gate, source, drain and n-well electrodes, said drain electrode being connected to an output node connected to said external bus, said gate terminal normally being connected to receive said data to be transmitted off-chip via said output node, and said source electrode being connected to said on-chip supply voltage;
- a tri-state control terminal connected to receive a tri-state control signal;
- tri-state means connected to said tri-state control terminal for biasing the n-well of said PMOS pull-up transistor to a higher one of said on-chip supply voltage or a voltage approximating that of said external bus voltage when said output driver circuit is tri-stated;
- an on-chip pump circuit generating said voltage approximating that of said external bus;
- an on-chip voltage comparator for comparing said bus voltage at the output node to said on-chip supply voltage; and
- gating means for connecting the gate and n-well of said PMOS pull-up transistor to said on-chip supply voltage if said on-chip supply voltage is higher than said bus voltage when said driver circuit is tri-stated, otherwise connecting said gate and n-well of said PMOS pull-up transistor to said on-chip generated pump circuit.

7. The output driver circuit recited in claim 5 wherein said on-chip comparator comprises:
- a differential comparator circuit having a first input connected to receive said on-chip supply voltage and a second input connected to said output node for generating a comparator output signal;
- logic means connected to said tri-state control terminal and responsive to said comparator output signal for generating first and second tri-state control signals;
- first gate means connected to said output node and responsive to said first tri-state control signal when said driver circuit is tri-stated, said first gate means biasing the n-well of said PMOS pull-up transistor to said voltage approximating that of said external bus voltage; and
- second gate means responsive to said second tri-state control signal when said driver circuit is not tri-stated, said second gate means biasing the n-well of said PMOS pull-up transistor to said on-chip supply voltage.

8. The output driver circuit recited in claim 7 wherein said first gate means is connected to said output node and said logic means comprises:
- a NAND gate having a first input connected to said tri-state control terminal, a second input connected to said comparator output, and an output supplying said second tri-state control signal; and
- an inverter having an input connected to the output of said NAND gate and an output supplying said first tri-state control signal, said inverter having a power supply terminal connected to said output node.

9. The output driver circuit recited in claim 7 wherein said differential comparator circuit means comprises:
- first and second cross-coupled transistors each having gate, source, drain and n-well electrodes, said source and n-well electrodes being connected to said on-chip supply voltage, said drain and gate electrodes of said first and second cross-coupled PMOS transistors being connected to one another, respectively, the junction of the drain electrode of said first PMOS transistor and the gate electrode of said second PMOS transistor being connected to said logic means;
- first and second NMOS transistors respectively connected in series with said first and second PMOS cross-coupled transistors, said first and second NMOS transistors having gate, source and drain electrodes, the gate electrode of said first NMOS transistor being connected to said on-chip supply voltage and the gate electrode of said second NMOS transistor being connected to said output node;
- coupling capacitor means connected between the drain of said first NMOS transistor and the gate of said second NMOS transistor; and bias means connected in common to the source electrodes of said first and second NMOS transistors.

10. The output driver circuit recited in claim 9 further comprising:
a third NMOS transistor connected in series with said single PMOS pull-up transistor, said third NMOS transistor having gate, source and drain electrodes; and
second logic means connected to said data terminal and said tri-state control terminal, said second logic means generating output signals which are applied to the gate electrodes of said third NMOS transistor and said single PMOS pull-up transistor.

11. The output driver circuit recited in claim 10 further comprising a complementary driver circuit between said second logic means and the gate of said single PMOS pull-up transistor and wherein said second logic means comprises:
a first invertor having an input connected to said tri-state control terminal and an output providing an inverted tri-state control signal;
a NOR gate having a first input connected to the output of said invertor, a second inverting input connected to said data terminal, and an output connected to said complementary driver circuit;
a NAND gate having a first input connected to said data terminal, a second inverting input connected to said tri-state control terminal, and an output; and
a second invertor having an input connected to the output of said NAND gate and an output connected to the gate of said third NMOS transistor.

12. The output driver circuit recited in claim 6 wherein said on-chip comparator comprises:
a differential comparator circuit having a first input connected to receive said on-chip supply voltage and a second input connected to said output node for generating a comparator output signal;
logic means connected to said tri-state control terminal and responsive to said comparator output signal for generating first and second tri-state control signals;
first gate means connected to said output node and responsive to said first tri-state control signal when said driver circuit is tri-stated, said first gate means biasing the n-well of said PMOS pull-up transistor to said voltage approximating that of said external bus voltage; and
second gate means responsive to said second tri-state control signal when said driver circuit is not tri-stated, said second gate means biasing the n-well of said PMOS pull-up transistor to said on-chip supply voltage.

13. The output driver circuit recited in claim 12 wherein said first gate means is connected to said on-chip pump circuit and said logic means comprises:
a NAND gate having a first input connected to said tri-state control terminal, a second input connected to said comparator output, and an output supplying said second tri-state control signal; and
an inverter having an input connected to the output of said NAND gate and an output supplying said first tri-state control signal, said inverter having a power supply terminal connected to said on-chip pump circuit.

14. The output driver circuit recited in claim 12 wherein said differential comparator circuit means comprises:
first and second cross-coupled PMOS transistors each having gate, source, drain and n-well electrodes, said source and n-well electrodes being connected to said on-chip supply voltage, said drain and gate electrodes of said first and second cross-coupled PMOS transistors being connected to one another, respectively, the junction of the drain electrode of said first PMOS transistor and the gate electrode of said second PMOS transistor being connected to said logic means;
first and second NMOS transistors respectively connected in series with said first and second PMOS cross-coupled transistors, said first and second NMOS transistors having gate, source and drain electrodes, the gate electrode of said first NMOS transistor being connected to said on-chip supply voltage and the gate electrode of said second NMOS transistor being connected to said output node;
coupling capacitor means connected between the drain of said first NMOS transistor and the gate of said second NMOS transistor; and
bias means connected in common to the source electrodes of said first and second NMOS transistors.

15. The output driver circuit recited in claim 14 further comprising:
a third NMOS transistor connected in series with said single PMOS pull-up transistor, said third NMOS transistor having gate, source and drain electrodes; and
second logic means connected to said data terminal and said tri-state control terminal, said second logic means generating output signals which are applied to the gate electrodes of said third NMOS transistor and said single PMOS pull-up transistor.

16. The output driver circuit recited in claim 15 further comprising a complementary driver circuit between said second logic means and the gate of said single PMOS pull-up transistor and wherein said second logic means comprises:
a first invertor having an input connected to said tri-state control terminal and an output providing an inverted tri-state control signal;
a NOR gate having a first input connected to the output of said invertor, a second inverting input connected to said data terminal, and an output connected to said complementary driver circuit;
a NAND gate having a first input connected to said data terminal, a second inverting input connected to said tri-state control terminal, and an output; and
a second invertor having an input connected to the output of said NAND gate and an output connected to the gate of said third NMOS transistor.

* * * * *